United States Patent [19]

Weirauch

[11] 4,094,677
[45] June 13, 1978

[54] CHEMICAL FABRICATION OF OVERHANGING LEDGES AND REFLECTION GRATINGS FOR SURFACE WAVE DEVICES

[75] Inventor: Donald F. Weirauch, Dallas, Tex.

[73] Assignee: Texas Instruments Incorporated, Dallas, Tex.

[21] Appl. No.: 429,475

[22] Filed: Dec. 28, 1973

[51] Int. Cl.² .............................................. G03C 5/00
[52] U.S. Cl. ........................................ 96/36; 156/647;
156/652; 156/655; 156/657; 156/659; 156/663; 156/664
[58] Field of Search ................... 96/36, 36.2; 156/8, 156/15, 11, 17, 647, 652, 655, 657, 659, 663, 664; 317/235, 234

[56] References Cited

U.S. PATENT DOCUMENTS

| | | | |
|---|---|---|---|
| 3,634,159 | 1/1972 | Croskery | 96/36.2 |
| 3,657,029 | 4/1972 | Fuller | 156/11 |
| 3,756,887 | 9/1973 | Cruthers | 156/11 |
| 3,785,892 | 1/1974 | Terry et al. | 156/17 |
| 3,799,642 | 3/1974 | Phillips et al. | 350/3.5 |
| 3,816,194 | 6/1974 | Kroger et al. | 317/234 |

*Primary Examiner*—Edward C. Kimlin
*Attorney, Agent, or Firm*—James T. Comfort; Rene' E. Grossman; William E. Hiller

[57] ABSTRACT

A method is described of etching structures into α quartz and $LiNbO_3$, two materials widely used in surface wave devices and which heretofore have not been found suitable for use with chemical etching techniques, in which concentrated HF acid at a predetermined temperature is used as an etchant, and the formation of overhanging ledges accomplished through a specific crystal orientation. Steps are shown which avoid the problems associated with suitable masking of the surface, which problems were encountered in the prior art, a primary step being one of a mechanical-chemical polishing to assure that the resist mask adheres to the surface properly.

2 Claims, 4 Drawing Figures

CHEMICAL FABRICATION OF OVERHANGING LEDGES AND REFLECTION GRATINGS FOR SURFACE WAVE DEVICES

BACKGROUND OF THE INVENTION

This invention relates to acoustic surface wave devices in general and more particularly to a method for forming reflection gratings and overhanging ledges in the materials α quartz and LiNbO$_3$ commonly used as substrates in such devices. Surface wave acoustic devices are gaining widespread use as filters, delay lines and the like. In particular, in frequency ranges between 10 mhz and 1 ghz, devices which are compact and provide numerous advantages over inductive capacitive type filters, and tuned electromagnetic wave guides are possible. This results directly from the fact that acoustic waves travel at a much slower speed than electromagnetic waves and thus, the size of a structure can be correspondingly smaller of the order of $10^5$.

When used in filtering applications these devices generally comprise a piezoelectric substrate on which are deposited two spaced transducers. The most common type of transducer used is what is known as the interdigital transducer wherein a plurality of fingers extend from a transducer pad on each side of the substrate and have overlapping portions. Electric fields created between the overlapping fingers of the transducer excite the piezoelectric material to generate the surface waves.

It is often desirable in surface wave devices to form reflection gratings which reflect the Rayleigh waves. For example, such ridges may be formed in the substrate at an angle of 45% with respect to the direction of propagation to cause a wave to make a 90° turn. A pair of such gratings can be used to cause a reversal in the direction of the wave. Furthermore, it is also desirable for some applications to form over-hanging ledges in substrates to permit denser packing of wave guides than is possible with a conventional plate-like acoustic wave guide.

Heretofore, it has not been thought possible to etch geometrical structures into the materials α quartz and LiNbO$_3$, both of which are widely used substrate materials, because of the unusual and severe chemical problems associated with these materials. Thus, where gratings or ledges were required, other types of materials had to be used. The primary problem encountered in trying to etch these materials was that of being able to apply a suitable mask or resist which would withstand the chemicals necessary for etching. The typical problem encountered was that of the mask or resist lifting off the surface of the substrate, thereby preventing selective etching.

Thus, it can be seen that there is a need for a controlled method of etching these desired materials, for use in acoustic wave guide devices.

SUMMARY OF THE INVENTION

The present invention solves the problem of etching the materials α quartz and LiNbO$_3$ through a method which includes a mechanical-chemical polishing of the substrate with an abrasive slurry material such as "Syton", (a trademark of the Monsanto Company of St. Louis, Missouri for a water slurry containing between 10–15% by weight of particulate silica) then sputtering layers of chromium (Cr) and gold (Au) onto the substrate surface, applying a photoresist, exposing with the desired pattern and developing. Thereafter, the pattern is etched into the Cr-Au using aqua regia followed by a chrome etch whereupon the substrate is immersed in HF for the desired length of time after which the Cr-Au is stripped off.

The same method is followed in making gratings and making ledges except that for ledges a specific orientation of the substrate is required to result in an etching action which ends up leaving an over-hanging ledge.

It has been discovered that a key step in the process is in the chemical-mechanical polishing and in particular the chemical polishing which removes all the amorphous material created on the surface during polishing. Prior attempts, using a normal type of mechanical polishing resulted in an amorphous layer being left on the surface which was dissolved by the etchant causing the resist mask to lift.

DETAILED DESCRIPTION OF THE PREFERRED EMBODIMENT

Figure 1:
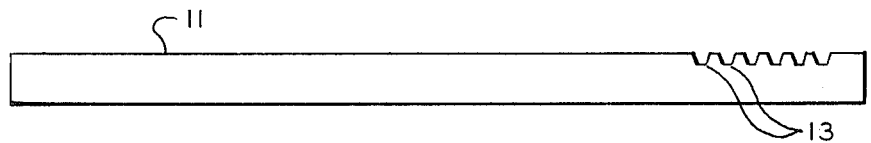
FIG. 1 is a cross-sectional view of an acoustic substrate having a grating formed therein.

FIG. 1 illustrates in cross-sectional view, the type of grating which might be required to be formed in a substrate. The substrate 11 which will be either α quartz or LiNbO$_3$ is required to have a plurality of strips 13 etched therein.

Figure 2:
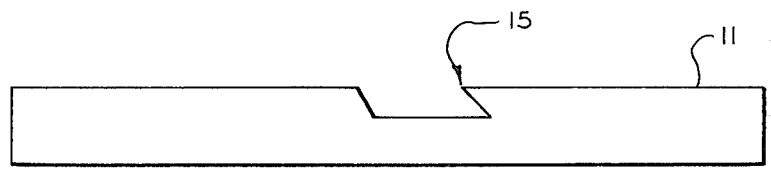
FIG. 2 is a similar cross-section illustrating a ledge.

FIG. 2 illustrates the type of cross-section required when a ledge is to be formed. Again, the substrate 11 will be of either α quartz or LiNbO$_3$. The desired cross-section is as shown with a ledge portion 15 extending out from the top surface. Such a ledge may be extremely beneficial in guiding and containing acoustic waves.

The basic steps to be followed in making either of the patterns illustrated by FIGS. 1 and 2 is the same. The main difference is in that to make overhanging ledges, a specific crystal orientation of the substrate is required as will be explained in more detail below. The first step and the most important is the polishing of the substrate. In order for the resist mask which is to be placed on the surface to adhere properly, it is necessary that all amorphous material and microcracks created during polishing be removed. Thus, polishing using a simple pitch lap method of polishing is not sufficient. Instead, it is necessary that a combined chemical-mechanical polishing system be used. As is understood in the art, chemical polishing involves the use of a chemical reagent having a mild etching effect on the material on the substrate surface to be polished thereby such that polishing occurs by chemical action. Combined chemical-mechanical polishing requires the use of a buffer pad, polishing cloth, or similar apparatus saturated with such a chemical reagent which is brought into engagement with the substrate surface to be polished, with relative movement then being caused the rebetween in a typical polishing pattern. A suitable surface can be prepared by polishing with an abrasive slurry, such as "Syton", a trademark of the Monsanto Company of St. Louis, Missouri for a water slurry containing between 10–15% by weight of particulate silica. Alternatively, it is possible to use a pitch lap method of polishing followed by an etching step to remove the amorphous material. After polishing, a layer of chromium is sputtered on top of the substrate. Typically, a layer of 508 A has been found to be suitable, although other thicknesses may be used. Over the chromium layer is sputtered a layer of gold which typically may be of a thickness in the order of 5,080 A i.e., approximately ten times the thickness of chromium. Again, the thicknesses here are not critical as long as it is sufficient to protect the substrate. Because of the chemical polishing, the resist of chromium and gold will have excellent adhesion to the substrate and will maintain this excellent adhesion upon exposure to HF acid. After sputtering of the chromium and gold onto the substrate surface, a photo-resist material is applied in conventional fashion, then exposed with the desired pattern and developed. The pattern is then etched into the Cr-Au layer using aqua regia to etch the gold followed by a chrome etch for etching the chromium. A typical chrome etch which has been found to be suitable is 1 volume of 0.2N $H_4Ce(SO_4)_4$ mixed with 1.5 volume of 7 N $HNO_3$. Once the desired pattern is formed in the Cr-Au i.e., either a pattern of gratings or an essentially rectangular pattern for the formation of a ledge, the substrate is immersed in HF for a length of time depending on the amount of material removal desired. If the material being etched is α quartz, concentrated HF acid is applied at room temperature i.e., 25° C. For Y-cut $LiNbO_3$, concentrated HF at a temperature above 100° C and preferably at the boiling point of HF i.e., 111° C, should be used. Typical etching times will run from four to twelve or more hours depending on the depth required. Once the desired degree of etching is obtained the substrate is removed from the HF and the Cr-Au layers stripped off using the same etchants as were used in etching the patterns therein [the photo resist, first having been removed].

Figure 3:
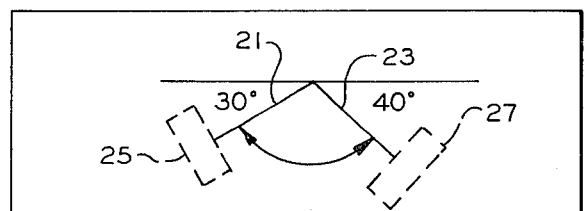
FIG. 3 is a plan view of an α quartz crystal substrate illustrating required orientation for ledge etching.

As noted above, the formation of overhanging ledges requires proper orientation of the substrate. Tests have shown that for an St cut of α quartz the orientation must be as shown on FIG. 3. As shown thereon, the ledge will only properly be formed between the lines 21 and 23 with the crystal orientation of the substrate as indicated by the plus x and minus x. Thus, there are shown at each end of the limits dotted lines outlining respective possible masks 25 and 27 which could be used. These represent the limits at which overhanging ledges can be formed. Anywhere between those limits of course, similar masks may be used to form such ledges.

Figure 4:
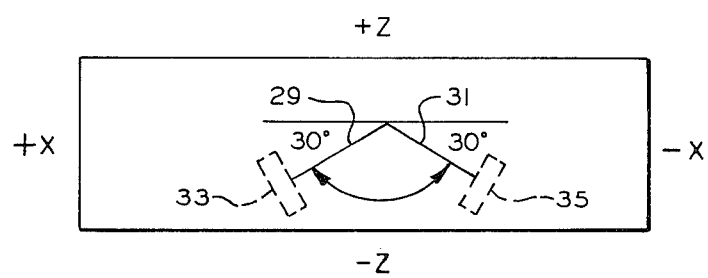
FIG. 4 is a similar view of an LiNbO$_3$ crystal.

FIG. 4 is a similar illustration for Y-cut $LiNbO_3$. The crystal must be oriented with its x and z axis as shown and when so oriented ledges can be formed within the limits between the lines 29 and 31. Again, masks perpendicular to those lines indicating the limits at which ledges can be formed and designated respectively 33 and 35, are indicated. The specifications for an ST cut of α quartz are disclosed in an article entitled "Growth, Orientation and Surface Preparation of Quartz" by D. T. Bell, published in the UltraSonic Symposium Proceedings of 1972, IEEE Sonics and UltraSonics p.p. 206 to 209.

Thus, a method for the chemical fabrication of overhanging ledges and reflection gratings in α quartz and $LiNbO_3$ has been disclosed. Although specific steps have been disclosed and described, it will be obvious to those skilled in the art that various modifications may be made without departing from the spirit of the invention which is intended to be limited solely by the appended claims.

What is claimed is:

1. A method of etching a surface of a substrate to be employed in an acoustic surface wave device, wherein the pattern to be etched into the substrate surface produces an overhanging ledge structure and the substrate is made of a piezoelectric material of ST cut α quartz, said method comprising:
    chemically polishing the surface of the substrate by applying a chemical mixture to the substrate surface effective to remove amorphous material from the substrate surface for providing a polished crystalline finish to the substrate surface,
    applying a layer of chromium over the polished substrate surface,
    applying a layer of gold over the chromium layer,
    applying a layer of photoresist material over the gold layer,
    photographically exposing the layer of photoresist material to a pattern of a desired image wherein the pattern is oriented so that its major axis is perpendicular to a line which falls within boundaries established by a first line making an angle of 30° with the $-X$ axis of the crystal lattice of said ST cut α quartz material and another line making an angle of 40° with the $+X$ axis of the said crystal lattice,
    developing the photoresist layer to produce the pattern therein,
    etching the pattern into the gold layer from the patterned photoresist layer,
    etching the pattern into the chromium layer,
    etching the pattern into said substrate surface by immersing the substrate surface with the patterned layers of chromium and gold thereon in a solution of hydrofluoric acid maintained at a temperature of approximately 25° C,
    removing the etched substrate surface with the patterned layers of chromium and gold thereon from the solution of hydrofluoric acid, and
    stripping off the patterned layers of gold and chromium from the etched substrate surface.

2. A method of etching a surface of a substrate to be employed in an acoustic surface wave device, wherein the pattern to be etched into the substrate surface produces an overhanging ledge structure and the substrate is made of a piezoelectric material of Y-cut lithium niobate, said method comprising:
    chemically polishing the surface of the substrate by applying a chemical mixture to the substrate surface effective to remove amorphous material from the substrate surface for providing a polished cyrstalline finish to the substrate surface,
    applying a layer of chromium over the polished substrate surface,
    applying a layer of gold over the chromium layer,
    applying a layer of photoresist material over the gold layer,
    photographically exposing the layer of photoresist material to a pattern of a desired image wherein the pattern is oriented so that its major axis is perpendicular to a line which falls within boundaries established by a first line making an angle of 30° with the $-X$ axis and 60° with the $-Z$ axis and a second line making an angle of 30° with the $+X$ axis and 60° with the $-Z$ axis of the crystal lattice of said Y-cut lithium niobate material,
    developing the photoresist layer to produce the pattern therein, etching the pattern into the gold layer from the patterned photoresist layer, etching the pattern into the chromium layer, etching the pattern into said substrate surface by immersing the substrate surface with the patterned layers of chromium and gold thereon in a solution of hydrofluoric acid maintained at a temperature of greater than 100° C, removing the etched substrate surface with the patterned layers of chromium and gold thereon from the solution of hydrofluoric acid, and stripping off the patterned layers of gold and chromium from the etched substrate surface.

* * * * *